United States Patent
Yu

(10) Patent No.: US 7,399,995 B2
(45) Date of Patent: Jul. 15, 2008

(54) BACKLIGHT MODULE FOR LIQUID CRYSTAL DISPLAY

(75) Inventor: Tai-Cherng Yu, Tu-Cheng (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/400,884

(22) Filed: Apr. 10, 2006

(65) Prior Publication Data

US 2007/0051960 A1 Mar. 8, 2007

(30) Foreign Application Priority Data

Sep. 5, 2005 (TW) ................... 94130333

(51) Int. Cl.
*H01L 33/00* (2006.01)
*G02F 1/1335* (2006.01)
*F21V 7/04* (2006.01)

(52) U.S. Cl. ................. 257/98; 257/100; 257/E33.067; 257/E33.074; 349/62; 349/65; 362/615; 362/621

(58) Field of Classification Search .......... 257/E25.019, 257/E33.074, 98, 100, E33.067; 349/61, 349/62, 64, 65; 362/608, 615, 621
See application file for complete search history.

(56) References Cited

U.S. PATENT DOCUMENTS

| 6,942,365 | B2 | 9/2005 | Galli | |
|---|---|---|---|---|
| 2004/0046222 | A1* | 3/2004 | Nagai et al. | 257/433 |
| 2004/0084681 | A1* | 5/2004 | Roberts | 257/79 |
| 2006/0133108 | A1* | 6/2006 | Choi et al. | 362/613 |
| 2006/0193148 | A1* | 8/2006 | Bang | 362/607 |

\* cited by examiner

*Primary Examiner*—Minh-Loan T Tran

(57) ABSTRACT

A backlight module includes a base, a plurality of point light sources distributed on the base and a light guide plate. Each of the point light sources includes a transparent cover and a light-emitting unit received in the cover. The transparent cover includes an inwardly curved light emitting top surface for emitting light from the light-emitting unit. The light guide plate includes an incidence surface disposed facing the point light sources, and an emission surface opposite to the incidence surface. The incidence surface includes a plurality of light diffusion areas spatially corresponding to the respective point light sources.

13 Claims, 3 Drawing Sheets

BACKLIGHT MODULE FOR LIQUID CRYSTAL DISPLAY

BACKGROUND

1. Technical Field

The present invention relates generally to backlight modules, and more particularly to a backlight module for use in a direct type liquid crystal display.

2. Background

Liquid crystal displays (LCDs) are widely used in various electronic products such as personal digital assistants (PDAs), notebook computers, digital cameras, digital camcorders, mobile telephones, computer monitors, liquid crystal televisions, and the like. Since LCD panels used in LCDs are not self-illuminating, they need a backlight module with a light source to illuminate the panels.

The backlight module enables colors of an image created on the LCD panel to be reproduced in real color by emitting white light from the rear of the LCD panel. As for the light source of the backlight, in the early days, Cold Cathode Fluorescent Lamps (CCFL) or External Electrode Fluorescent Lamps (EEFL) were used. However, with the advent of efficient Light-emitting Diodes (LEDs) with good physical and chemical properties, it has been suggested that LEDs may be employed as backlight light sources.

LEDs are semiconductor light-emitting devices, which emit various colors of light. LEDs can be composed of various semiconductor materials, such as GaAs, AlGaAs, GaN, InGaN and AlGaInP (Where Ga is gallium, As is arsenic, Al is aluminium, N is nitrogen, In is indium and P is potassium). Compared to other sources of illumination LEDs have the advantage of having a low operation voltage, high brightness, short response time and long lifetime. Furthermore, an important advantage of LEDs is that they are free of mercury, and are thus more environmentally friendly than other light sources, such as CCFLs.

Generally, an LED includes a base, a cover made of a plastic material, and an LED chip mounted in the cover. The cover has a top surface for emitting light generated by the LED chip.

As for the backlight module employing the LED, a conventional direct illumination type backlight module in which the light source of the backlight module emits light directly under the light guide plate of the backlight module panel is proposed. Due to the point light source, the illumination on the incidence surface of the light guide plate has poor uniformity. A number of darker areas are distributed on the incidence surface opposite to the central point between two adjacent LEDs. This will cause poor illumination uniformity of the light emitted from the emissive surface. Therefore, a backlight module employing LEDs as the light source with high brightness uniformity is desired.

SUMMARY

In one embodiment, a backlight module includes a base, a plurality of point light sources distributed on the base and a light guide plate. Each of the point light sources includes a transparent cover and a light-emitting unit received in the cover. The transparent cover includes an inwardly curved light emitting top surface for emitting light from the light-emitting unit. The light guide plate includes an incidence surface positioned facing the point light sources, and an emission surface facing away from the incidence surface. The incidence surface includes a plurality of light diffusion areas each spatially corresponding to their respective point light sources.

This and other objects, features and advantages of the present invention as well as the preferred embodiments thereof and techniques for fabricating a metal nanowire array in accordance with the invention will become apparent from the following detailed description and the description of the drawings, in which:

DETAILED DESCRIPTION OF PREFERRED EMBODIMENTS

Figure 1:
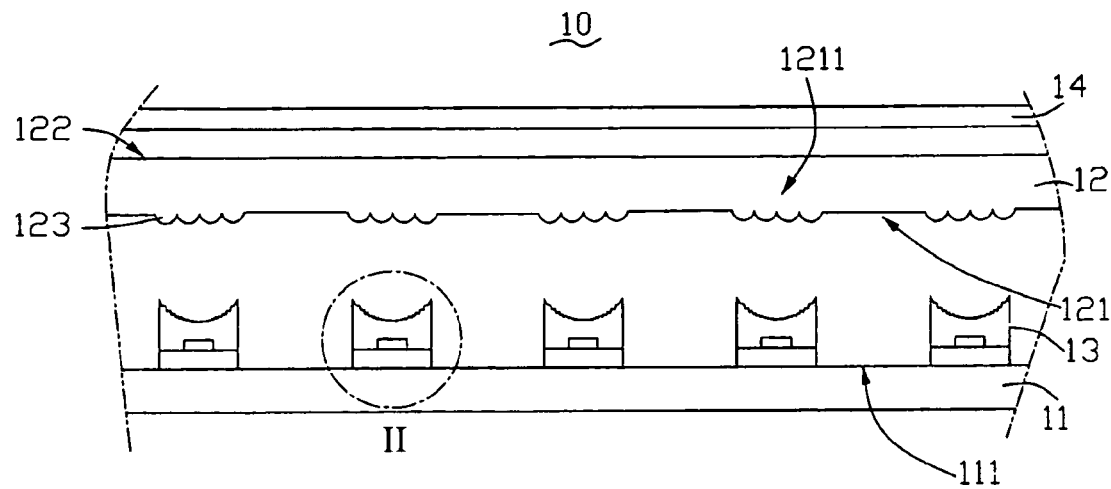
FIG. 1 is a schematic view of a backlight module having a number of LEDs, in accordance with a preferred embodiment.

Referring to FIG. 1, a direct backlight module 10 in accordance with a preferred embodiment is illustrated. The backlight module 10 includes a base 11, a light guide plate 12 disposed above the base 11, and an optical film 14 disposed on the light guide plate 12. The base 11 includes a top surface 111 facing opposite the light guide plate 12. A number of point light sources for example LEDs (light-emitting diodes) 13 are mounted on the top surface 111. The light guide plate 12 is a flat sheet having a uniform thickness. The light guide plate 12 includes an incident surface 121, an emissive surface 122 opposite to the incident surface. The optical film 14 is made of a transparent material such as glass for scattering light beams transmitted from the light guide plate 14.

The light guide plate 12 is made of a transparent material selected from the group consisting of polymethyl methacrylate, polycarbonate, polyethylene resin, and glass. The incident surface 121 is disposed facing the LEDs 13 for receiving incoming light beams emitted from the LEDs 13. The emissive surface 122 and the incident surface 121 are parallel to each other. The emissive surface 122 is for emitting light beams from the light guide plate 12. The incident surface 121 includes a number of light diffusion areas 1211 each spatially corresponding to their respective LEDs 13. In the illustrated exemplary embodiment, the light diffusion areas 1211 are vertically aligned with respect to their respective LEDs 13. A number of diffusion units 123 are formed on each of the diffusion areas 1211. The diffusion units 123 include diffusion dots in many shapes such as cylindrical or cone-shaped, grooves or protrusions.

Figure 2:
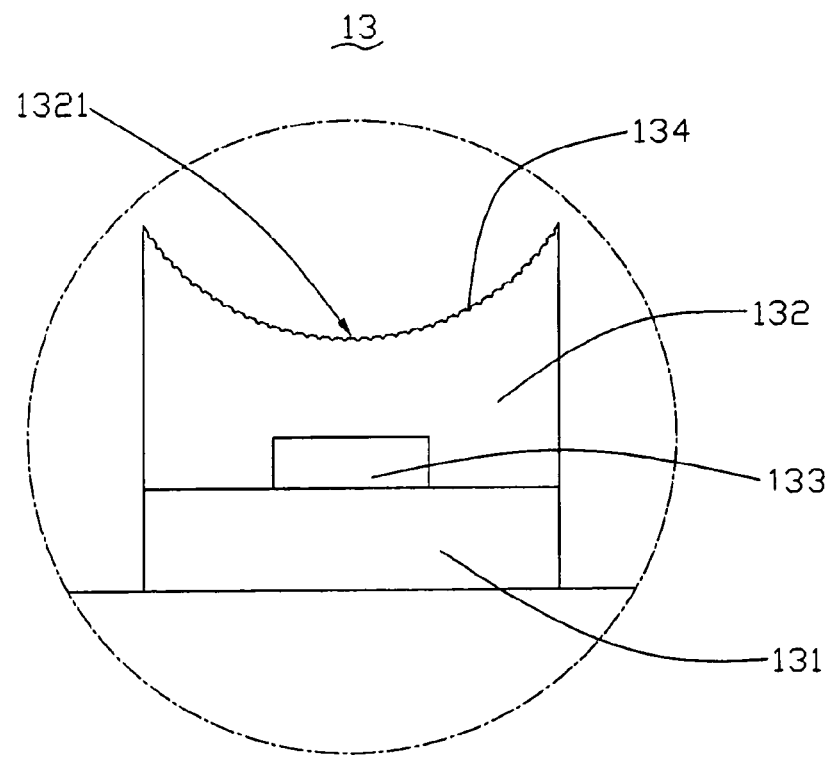
FIG. 2 is an enlarged view an exemplary LED of FIG. 1.

Referring to FIG. 2, each of the LEDs 13 includes a base 131, an LED chip 133 mounted on the base 131, and a cover 132 made of a transparent material, such as polymethyl methacrylate, polycarbonate, polyethylene resin, and glass. The LED chip 133 is packaged inside the cover member 132. The cover 132 of the LED chip 133 includes an inwardly (i.e. downwardly) curved light emitting top surface 1321 for emitting light from the LED chip 133. The inwardly curved light emitting top surface 1321 can be arc-shaped (i.e. saddle-shaped). Advantageously, the inwardly curved light emitting top surface is semi-spherical-shaped or semi-ellipse-shaped.

A number of diffusion dots 134 are regularly arranged on the inwardly curved light emitting top surface 1321. The diffusion dots 134 can be made by means of a printing process or an injection molding process. Each of the diffusion dots 134 extends downwards or upwards from the inwardly curved light emitting top surface 1321. The diffusion dots 134 can be cylindrical or cone-shaped. In the preferred embodiment, the diffusion dots 134 are cylinders (i.e. cylindrical protrusions).

A cross section of each of the diffusion dots 134 is an elliptical sector (i.e. elliptical fan-shaped) or a circular sector (i.e. circular fan-shaped). In the preferred embodiment, the cross sections of the diffusion dots 134 are circular sectors.

The diffusion dots 134 formed on the inwardly curved light emitting top surface 1321 and the diffusion units 123 formed on the incidence surface 121 can disperse the light beams emitted from the LED chip 133, so as to improve an illumination uniformity of the light beams.

Figure 3:
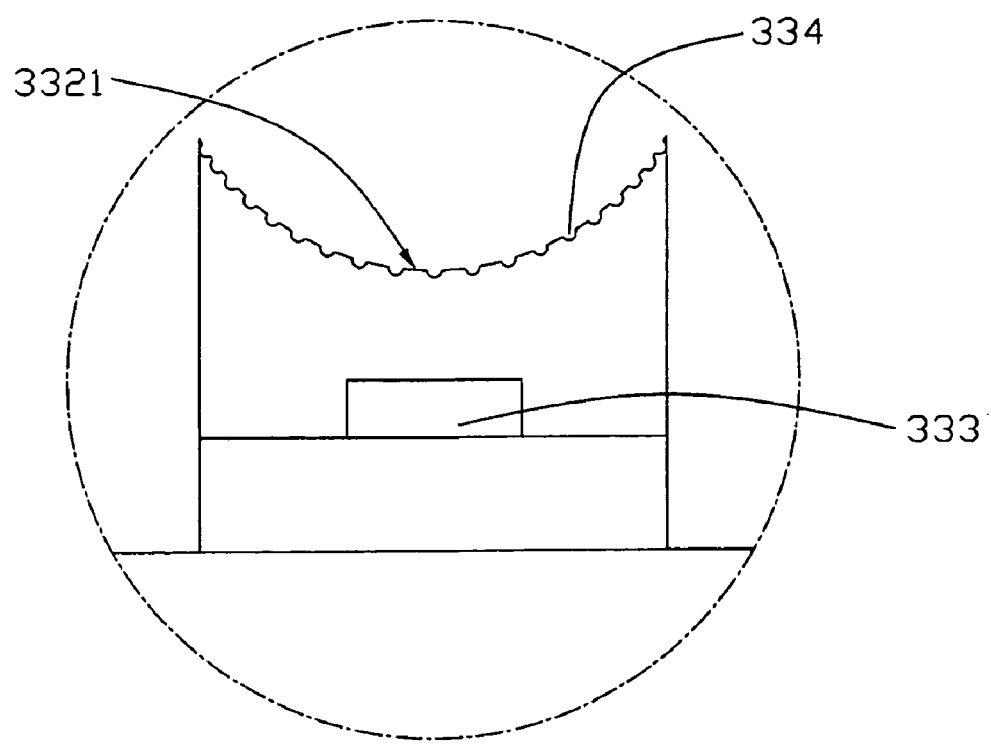
FIG. 3 is a schematic view of an LED in accordance with a second preferred embodiment.

Referring to FIG. 3, an LED according to a second embodiment is similar to that of the first embodiment except that the distribution manner of the diffusion dots 334. A distribution density of the diffusion dots 334 gradually increases with increasing of distance away from a center of the inwardly curved light emitting top surface 3321. Specifically, the distribution density of the diffusion dots 334 at a distance from the LED chip 333 is bigger than that of the diffusion dots 334 near the LED chip 333. Generally, due to the point light source, intensity of light beams emitted from the LED chip 333 gradually decreases with increasing distance from the LED chip 333. In the preferred embodiment the distribution manner of the diffusion dots 334 assures that the diffusion effect becomes stronger with increasing distance away from a center of the inwardly curved light emitting top surface 3321, so as to obtain a high illumination uniformity LED and a high illumination uniformity backlight module.

Figure 4:
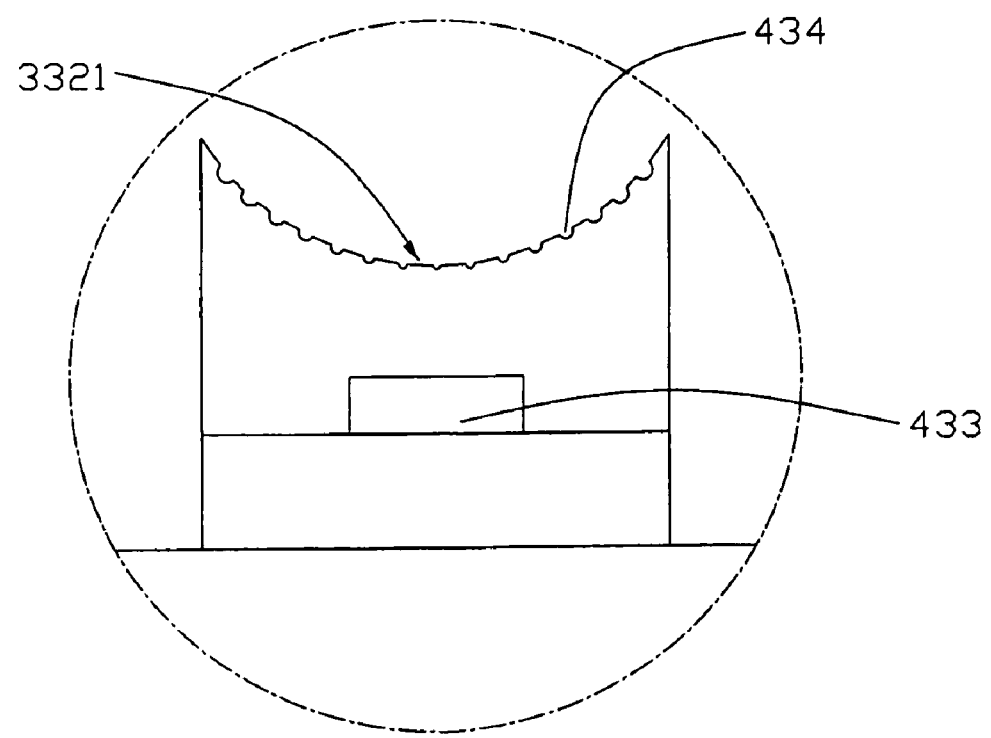
FIG. 4 is a schematic view of an LED in accordance with a third preferred embodiment.

Referring to FIG. 4, an LED according to a third embodiment is similar to that of the first embodiment except for the distribution pattern of the diffusion dots 434. The diffusion dots 434 gradually increase in size with increasing of distance away from a center of the inwardly curved light emitting top surface 4321. Specifically, the size of the diffusion dots 434 near the LED chip 433 is smaller than that of the diffusion dots 434 at a distance from the LED chip 433. The bigger size of the diffusion dots 434 is, the stronger the diffusion effect that is obtained. So in the preferred embodiment the distribution manner of the diffusion dots 434 assures that the diffusion effect becomes stronger with increasing distance from a center of the inwardly curved light emitting top surface 4321, thus obtaining a high illumination uniformity LED and backlight module.

Figure 5:
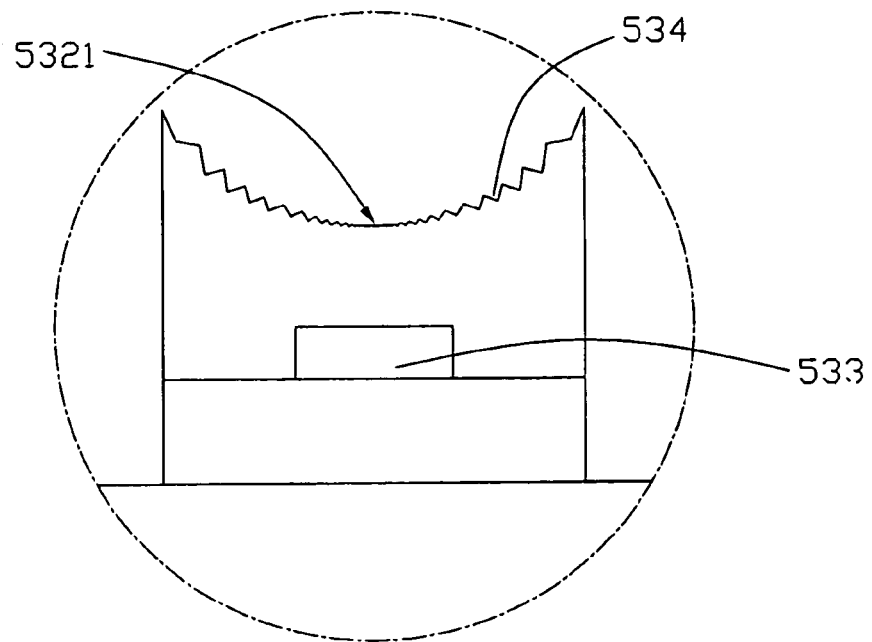
FIG. 5 is a schematic view of an LED in accordance with a fourth preferred embodiment.

Referring to FIG. 5, an LED according to a fourth embodiment is similar to that of the first embodiment except that the diffusion dots on the inwardly curved light emitting top surface 5321 are replaced by a number of V-shaped grooves/protrusions 534 formed on the inwardly curved light emitting top surface 5321. The vertex angle of the grooves/protrusions are in the range from 60° to 150°. Preferably, the vertex angle of the grooves/protrusions gradually increases with increasing distance from a center of the inwardly curved light emitting top surface 5321. The grooves/protrusions can disperse the light like the diffusion dots. So in the preferred embodiment a high illumination uniformity LED and backlight module can be obtained.

Figure 6:
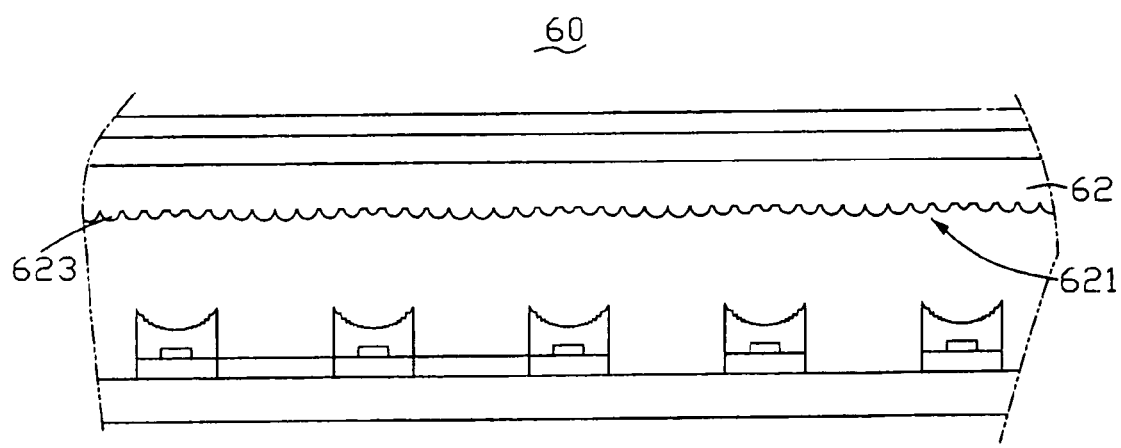
FIG. 6 is a schematic view of a backlight module, in accordance with a fifth preferred embodiment.

Referring to FIG. 6, a direct backlight module 60 in accordance with a fifth preferred embodiment is illustrated. The backlight module of the second embodiment is similar to the backlight module of the first embodiment, except that the distribution pattern of the diffusion dots 623 on each of the diffusion area is different. A distribution density of the diffusion dots 623 in each of the diffusion areas gradually increases with increasing of distance away from a center of the diffusion area. Furthermore, the dots 623 gradually increase in size with increasing distance from a center of the diffusion area.

Finally, it is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

What is claimed is:

1. A backlight module comprising:
a base;
a plurality of point light sources distributed on the base, each of the point light sources comprising a transparent cover and a light-emitting unit received therein, the light-emitting unit being configured for generating emitted light, the transparent cover comprising an inwardly curved light emitting top surface configured for emitting therethrough light emitted from the light-emitting unit; and
a light guide plate comprising an incidence surface disposed facing the point light sources, and an emission surface opposite to the incidence surface, the incidence surface comprising a plurality of light diffusion areas each spatially corresponding to their respective point light sources.

2. The backlight module as claimed in claim 1, wherein the inwardly curved light emitting top surface is an arc-shaped surface.

3. The backlight module as claimed in claim 1, wherein the cover comprises a plurality of diffusion units arranged on the inwardly curved light emitting top surface.

4. The backlight module as claimed in claim 3, wherein the diffusion units are a plurality of diffusion dots.

5. The backlight module as claimed in claim 4, wherein a distribution density of the diffusion dots gradually increases with increasing distance from a center of the inwardly curved light emitting top surface.

6. The backlight module as claimed in claim 4, wherein a size of each of the diffusion dots gradually increases with increasing distance from a center of the inwardly curved light emitting top surface.

7. The backlight module as claimed in claim 3, wherein the diffusion units are a plurality of V shaped grooves/protrusions defining a vertex angle in the range from 60° to 150°.

8. The backlight module as claimed in claim 7, wherein a vertex angle of the groove gradually increases with increasing distance away from the light-emitting unit.

9. The backlight module as claimed in claim 1, wherein the point light sources are light-emitting diodes.

10. The backlight module as claimed in claim 1, wherein the transparent cover is made of a material selected from the group consisting of glass, polymethyl methacrylate, polycarbonate and polyethylene terephthalate.

11. The backlight module as claimed in claim 1, wherein a plurality of light diffusion units are arranged on each of the light diffusion areas.

12. The backlight module as claimed in claim 11, wherein a distribution density of the diffusion units in each of the diffusion areas gradually increases with increasing distance from a central area of the light diffusion area.

13. The backlight module as claimed in claim 11, wherein a size of the diffusion units in each of the light diffusion areas gradually increases with increasing distance from a center area of the light diffusion area.

* * * * *